United States Patent [19]

Furuhata et al.

[11] 3,953,503

[45] Apr. 27, 1976

[54] METHOD OF MANUFACTURING TRIGLYCINE SERIES FERROELECTRIC CRYSTALS

[75] Inventors: Yoshio Furuhata, Kodaira; Yasuo Kato; Zenmon Abe, both of Kokubunji, all of Japan

[73] Assignee: Hitachi, Ltd., Japan

[22] Filed: Feb. 2, 1973

[21] Appl. No.: 329,193

Related U.S. Application Data

[63] Continuation-in-part of Ser. No. 800,637, Feb. 19, 1969, abandoned.

[30] Foreign Application Priority Data

Feb. 21, 1968 Japan.............................. 43-10530
Feb. 21, 1968 Japan.............................. 43-10531

[52] U.S. Cl........................ 260/534 S; 260/534 R; 23/273 R; 23/301 R; 317/262 F
[51] Int. Cl.²....................................... C07C 101/06
[58] Field of Search.................... 260/534 S, 534 R; 23/301 R, 273 R, 273 H

[56] References Cited
UNITED STATES PATENTS

| | | | |
|---|---|---|---|
| 1,438,965 | 12/1922 | Nicolson | 23/273 R |
| 1,746,144 | 2/1930 | Christopher | 23/273 R |
| 2,986,681 | 5/1961 | Matthias | 317/262 |
| 3,352,906 | 11/1967 | Parkenson et al. | 260/534 |
| 3,607,108 | 9/1971 | Gehres | 23/301 R |

FOREIGN PATENTS OR APPLICATIONS

| | | |
|---|---|---|
| 555,243 | 4/1958 | Canada |
| 555,244 | 4/1958 | Canada |
| 797,844 | 7/1958 | United Kingdom |

OTHER PUBLICATIONS

Furuhata, J. Phys. Soc. Jap. Suppl., 1969, (pub. 1920), 28 425–427.
Stankowska et al., C. A., 55, 15135d.
Koldobskaya et al., C.A., 65, 19372b, (1966).

*Primary Examiner*—John F. Terapane
*Attorney, Agent, or Firm*—Craig & Antonelli

[57] ABSTRACT

A method of manufacturing large ferroelectric crystals having desirable uniform characteristics throughout the crystal from heterogeneous ferroelectric crystals in which only natural faces having the lowest surface energy are allowed to grow while preventing other faces from growing, or the heterogeneous ferroelectric crystals are subjected to a heat treatment so that the entire crystal comes to have the desirable characteristics.

14 Claims, 9 Drawing Figures

METHOD OF MANUFACTURING TRIGLYCINE SERIES FERROELECTRIC CRYSTALS

CROSS-REFERENCES TO RELATED APPLICATIONS

The present application is a continuation-in-part application of application Ser. No. 800,637 filed Feb. 19, 1969, now abandoned.

BACKGROUND OF THE INVENTION

1. FIELD OF THE INVENTION

The present invention relates to a method of manufacturing ferroelectric crystals, and more particularly to a method of manufacturing ferroelectric crystals, for example, tri-glycine series ferroelectric crystals having characteristics suitable for use in various applications in electronics from heterogeneous crystals.

2. Description of the Prior Art

There are various ferroelectric crystalswwhich are recently found not to be homogeneous such as tri-glycine sulphate, guanidine aluminum sulphate hexahydrate, tri-hydrogen lithium selenite, di-calcium strontium propionate, and their isomorphous ferroelectric crystals. All of these crystals are water soluble. The manufacturing method according to the present invention hereinafter described is applicable to all these ferroelectric crystals. However, the following description of the method according to the present invention will be made with reference to tri-glycine sulphate and its isomorphous ferroelectric crystals only for the sake of simplicity.

Tri-glycine sulphate (hereinafter referred to as TGS), tri-glycine selenate (hereinafter referred to as TGSe), tri-glycine fluoberyllate (hereinafter referred to as TGFB), deuterated TGS (hereinafter referred to as DTGS) and deuterated TGSe (hereinafter referred to as DTGSe) are known as tri-glycine series (hereinafter referred to as TG series) ferroelectrics. All of these ferroelectrics are water soluble crystals having similar crystal structures. Their Curie temperatures are believed to be around 49°C, 22°C, 70°C, 60°C and 34°C, respectively. These crystals are promising in the application to electronic elements such as ferroelectric DC - AC converters, acoustoelectric transducers, infrared ray detectors, memory storage devices and the like. However, since crystals produced by a conventional water solution method have disadvantages as described later, they have seldom been used in practice.

When TG series ferroelectric crystals are employed as electronic elements as described above, it is desirable in practice to produce a single crystal having a b-plane large in area because a b-plate crystal in which the ferroelectric axis (b-axis) is perpendicular to the plane of the plate is employed for such electronic elements.

A b-plate crystal of TG series ferroelectric material can be obtained by producing an idiomorphic single crystal by a rotatory cooling method or circulating method similarly to ordinary water soluble crystals and by cleaving the crystal perpendicularly to the b-axis. However, this method has the disadvantage that the area of the b-plane necessary for technological application is not so large. Accordingly, the following non-stirring cooling method is usually practised for obtaining a large b-plate crystal.

That is, two glass plates are positioned horizontally and parallel with each other. The lower glass plate is provided at its center portion with a recess in which a seen crystal is fixed with its b-axis being directed vertically. Then, the glass plate assembly is submerged in a mother liquid and cooled quietly to grow the crystal in directions perpendicular to the b-axis. By this method a b-plate crystal having a large area of b-plane, of the order of several cm in the direction of the a-axis, can be provided relatively easily.

The appearance of a large size b-plate crystal obdtained as stated above is generally as shown in the central portion of FIG. 1. In FIG. 1, reference numeral 1 designates the seed crystal, and 2 designates the b-plate crystal. Arrows $a$, $b$ and $c$ at the upper left indicate directions of the crystal axes.

According to the investigation made by the inventors, the entire surface of the b-plate crystal does not have a uniform property. This is the case also for the b-plate crystal obtained by cleaving the aforementioned idiomorphic crystal. According to the results of observations of the growth pattern, cleavability, domain structure, dislocation density, etc., the b-plate crystal seems to be substantially separated into four pairs of regions as indicated by chain lines in FIG. 1, that is, four pairs of sector regions connecting the seed crystal and (001) plane, the seed crystal and (101) plane, the seed crystal and (110) and ($\bar{1}$10) planes, and the seed crystal and ($\bar{1}$11) and (11$\bar{1}$) planes, which will hereinafter be referred to as (001) region, (101) region, (110) region, and ($\bar{1}$11) region, respectively. If these regions are observed from the view point of lattice defects, (001) region is the one having the least lattice defects, (110) and ($\bar{1}$11) regions are those having the most lattice defects, and (101) region is the one having intermediate lattice defects.

Furthermore, electrical and dielectric characteristics also show a marked difference from region to region. For example, polarization (P) versus electric field (E) hysteresis loops, i.e. dielectric hysteresis loops measured on a b-plate crystal of TGS show marked difference from region to region as indicated by $(a_1)$, $(a_2)$ - - - $(a_8)$ in FIG. 1. In ($\bar{1}$11) and (110) regions, the spontaneous polarization $P_s$ is small and the internal biased field $E_b$ is large, and hence the hysteresis characteristic is poor, while in (001) region the spontaneous polarization $P_s$ is large and the internal biased field $E_b$ is small, and hence the hysteresis characteristic is excellent. In (101) region, the spontaneous polarization $P_s$ and internal biased field $E_b$ show intermediate values. For example, on an average $P_s$ ($\bar{1}$11) = (1/5) − (1/10) × $P_s$ (001), $P_s$ (110) = (2/3) − (1/5) × $P_s$ (001), $P_s$ (001) = 3.3 $\mu$ coulombs/cm$^2$ at room temperature. Consequently, (001) region is among the four regions the most suitable for various applications in electronics. For example, in second harmonic type modulators, the fact that the internal biased field $E_b$ is small is a necessary condition for an element because the internal biased field $E_b$ is a main cause for the offset. In pyroelectric infrared ray detectors, the sensitivity thereof corresponds to the magnitude of the spontaneous polarization $P_s$.

Furthermore, (001) region is low in density of lattice defects and excellent in its electrical characteristics as compared with other regions. These facts can be seen from the following consideration. The surface energy of a natural face is determined mainly be the state of chemical bond in a cuboid corresponding to the unit cell of the TGS series ferroelectric material. In regard to (001) plane, among the six planes of the unit cell the bond of only one of (001) planes is disconnected. In regard to (101) plane, among the six planes, the bonds of each one of (100) and (001) planes are disconnected. In regard to (110) plane, among the six planes, the bonds of each one of (100) and (010) planes are disconnected. Since the b-axis is the ferroelectric axis in TGS series ferroelectrics, electric charges appear at (010) plane and the electrostatic energy is large. In regard to ($\bar{1}$11) plane, among the six planes, the bonds of each one of (100), (010) and (001) planes are disconnected. Consequently, the relation between the amounts of surface energies U of natural faces is $$U_{(001)} < U_{(101)} < U_{(110)} < U_{(\bar{1}11)}$$

Since the density of lattice defects in a crystal face depends on the surface energy, the density is lowest in (001) face and highest in ($\bar{1}$11) face. Since a bulk of crystal is the stacking of planes, the relation between the bulk densities $n$ of lattice defects is $$n_{(001)} < n_{(101)} < n_{(110)} < n_{(\bar{1}11)}$$

Also, since the elecrical characteristics depend on the density of defects, in particular impurity ions and charge jogs, the region having the least defects has the best electrical characteristics. Thus, (001) region is the least in point type (impurities, vacancies, etc.), linear type (dislocations), and planar type (domain walls, stacking fault) defects, and, as a result, the best in electrical characteristics. Consequently, it is good to cut out crystals for use as electronic elements from (001) region.

Further, according to measurements by the inventors, (001) region is large in maximum value of the dielectric constant, large in pyroelectric coefficient and piezoelectric constant, and uniform in its characteristics throughout the region.

The abovementioned characteristics are recognized not only in TGS, but also in TGSe, TGFB, DTGS and DTGSe.

However, in a b-plate crystal provided by the conventional method of fabricating single crystals, a region having favorable characteristics is only a portion of the crystal as seen from the above description, and hence there is the disadvantage that practically the yield is very low.

SUMMARY OF THE INVENTION

Therefore, it is an object of the present invention to provide a method of manufacturing a large ferroelectric single crystal the greater part of which has desirable characteristics.

To attain the above-mentioned object, in the method of producing TG series ferroelectric crystals according to the present invention a cuboid having (001) faces, (010) faces and two other faces perpendicular to the (001) and (010) faces and elongated in a [100] direction is first cut out from a (001) region of a b-plate of a TG series ferroelectric material. The cuboid is of a single domain and used as a seed crystal. The two faces perpendicular to the (001) and (010) faces of the cuboid or seed crystal are fitted in grooves in a breeder frame. Glass plates are adhered to the (010) faces, respectively, of the seed crystal and the breeder frame so that the seed crystal can grow only at the (001) faces. The resulting structure is immersed in a breeding mother liquid. The temperature of the breeding mother liquid at the time of start of growth is sufficient to lie within ranges of 25° to 90° C, 25° to 90° C, 25° to 90° C, 25° to 80° C and 25° to 80° C and preferably within ranges of 35° to 60° C, 35° to 50° C, 35° to 60° C, 35° to 40° C and 35° to 40° C for TGS, TGSe, TGFB, DTGS and DTGSe, respectively. The breeding mother liquid is then cooled gradually so that the seed crystal grows in a direction perpendicular to the (001) face. The fluctuation or accuracy of temperature and the cooling rate are desirably not higher than 0.05° C and 0.5° C/day, respectively. If the starting temperature of growth is higher than the Curie temperature of the material to be grown, it is necessary to expose the grown crystal to a DC electric field of from 300 V/cm to 10 kV/cm, preferably about 1 kV/cm, in a direction of the b-axis for about 10 minutes through, for example, electrodes provided on the (010) faces of the crystal. If the above growth condition is not satisfied, no good quality crystal can be prepared.

BRIEF DESCRIPTION OF THE DRRAWING

DESCRIPTION OF THE PREFERRED EMBODIMENTS

Figure 1:
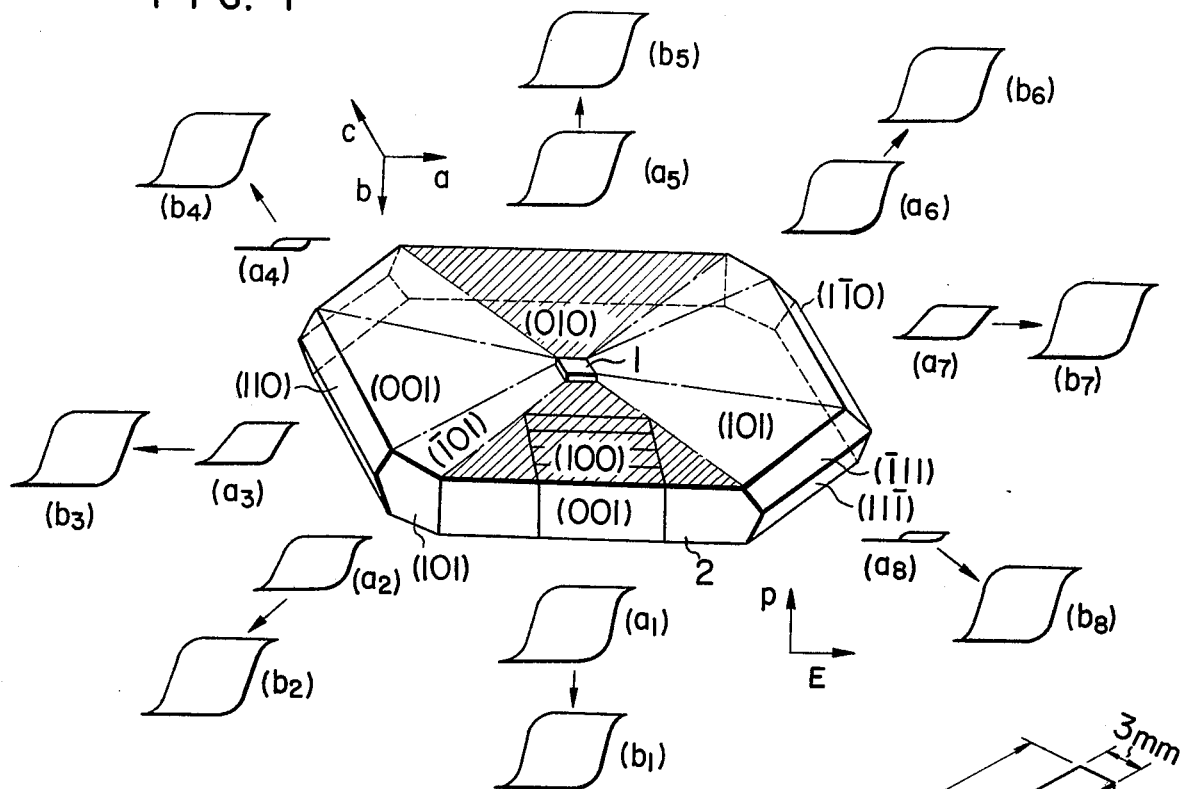
FIG. 1 is a schematic diagram of a b-plate crystal of tri-glycine sulfate manufactured by a conventional method and variations in dielectric hysteresis loops at various regions.
Figure 2:
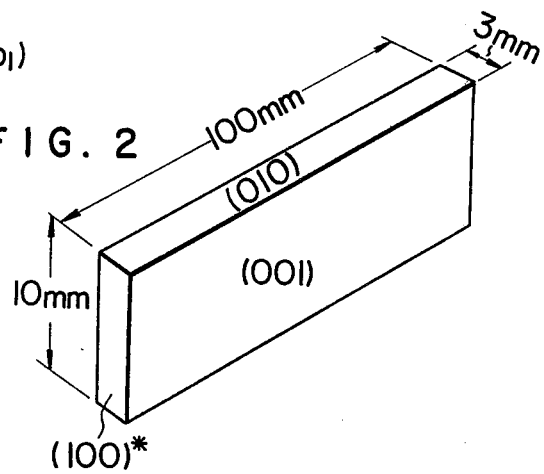
FIG. 2 is a perspective view of a seed crystal employed in the present invention.

From (001) region of a b-plate crystal as shown in FIG. 1 a cuboid elongated in a [100] direction having (001), (010) and (100)* faces as shown in FIG. 2 is cut out, (100)* faces being perpendicular to (001) and (010) faces. An example of the dimension of the cuboid is 100 × 10 × 3 mm³.

Figure 3:
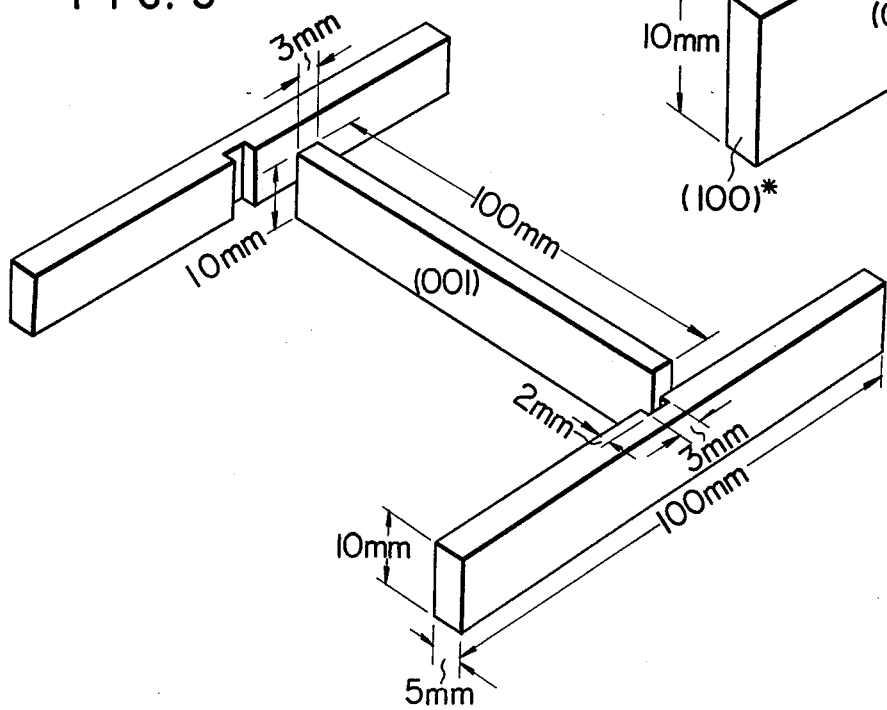
FIG. 3 is a perspective view of breeder frames employed in the invention.
Figure 4:
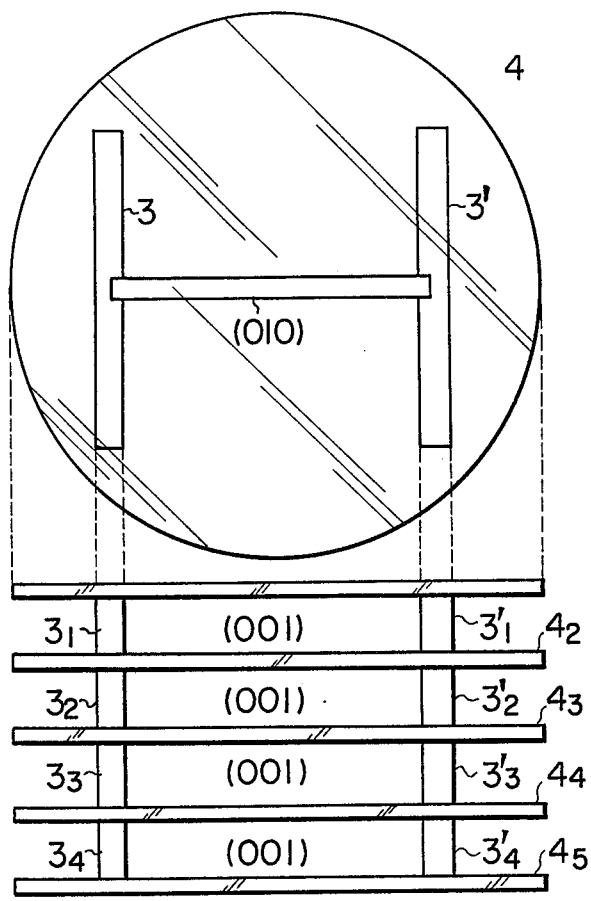
FIG. 4 is a schematic diagram of an arrangement of breeder frames employed in the present invention.
Figure 5:
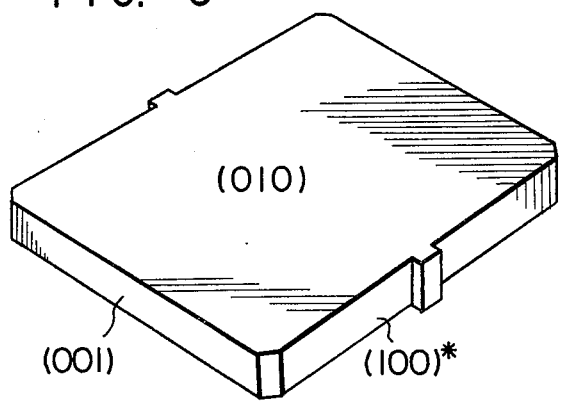
FIG. 5 is a perspective view of a b-plate crystal of tri-glycine sulphate manufactured by the arrangement of FIG. 4.

Each (100) face edge of the seed crystal is fitted in a groove provided to a breeder frame as shown in FIG. 3, and bonded thereto with an adhesive. An example of the breeder frame is a 100 × 10 × 5 mm³ glass block with a groove 2 mm deep and 3 mm wide. Glass discs having a diameter of, for example, 150 mm are then bonded to the upper and lower ends of the structure and several of them are stacked as shown in FIG. 4. Thus, the faces of the seed crystal capable of growing freely are only the (001) faces. Next, the arrangement is submerged in a TGS breeding mother liquid and cooled gradually. Then large (001) crystals of the shape as shown in FIG. 5 having excellent electrical characteristics are obtained. Of course, a seed crystal may be again prepared from the thus obtained crystal.

An example of the growth condition is as follows: The initial or starting temperature of growth is 40° C. The accuracy of the temperature control of the liquid is 0.01° C. The cooling rate is 0.2° C/day. Then, with 10 l of mother liquid and five seed crystals, (001) crystals having a dimension of 10 cm × 10 cm × 1 cm were obtained after 30 days.

The thus obtained large b-plate crystal is substantially of a single domain and has a substantially uniformly distributed density of dislocations less than 100/cm$^3$. The hysteresis characteristic is also substantially uniform corresponding thereto, the biased field $E_b$ is very small, and the spontaneous polarization $P_s$ is substantially the same as that of an ideal crystal. Also the dielectric properties thereof are desirable ones in that a maximum of dielectric constant near the Curie temperature is a very sharp, as high as several hundred thousands, and the dielectric loss is very low.

Further, the crystal is not only excellent in electrical properties such as hysteresis, dielectric, and conductive properties, but also it has favorable features from a crystal working point of view. For example, since the crystal is of a single domain, and moreover, it has only a few lattice defects, the cleavage thereof is very easy. In addition, when the crystal is made thin by an etching method, thinning is far easier than with the conventionally obtained crystals because the entire body becomes thin uniformly keeping surfaces parallel. The easiness of the thinning is practically very effective because electronic elements often require a thin plate of crystal. For example, the sensitivity of a pyroelectric infrared ray detector is inversely proportional to the thickness of the element thereof, and the conversion efficiency of a second harmonic type modulator is also inversely proportional to the thickness of the element thereof.

According to the results of employment of a crystal obtained according to the method of the present invention as a second harmonic type modulator, the drift was less than 100 $\mu$V/day which is better than the drift of a vibrating reed type modulator. The drift of the conventionally obtained crystal was about several hundreds of $\mu$V/day.

When crystals obtained according to the present invention were employed as infrared $^{-10}$ detectors, the ones having an excellent noise equivalent power comparable with a Goley cell, $5 \times 10^{116 \ 10}$ W/ $\sqrt{Hz}$, were obtained with a yield of 70 %. In contrast, the yield of crystals having a comparable performance obtained by the conventional method was less than 10 %. It is desirable that the seed crystal employed in the present invention is one which is cut from the crystal prepared by the method according to the present invention. If the starting temperature of growth is lower than the Curie temperature of the material to be grown, the seed crystal has, of course, to be of single domain. However, a seed crystal having uniform desirable properties can also be obtained from a conventionally prepared heterogeneous crystal by subjecting the heterogeneous crystal to a heat treatment.

Figure 6A:
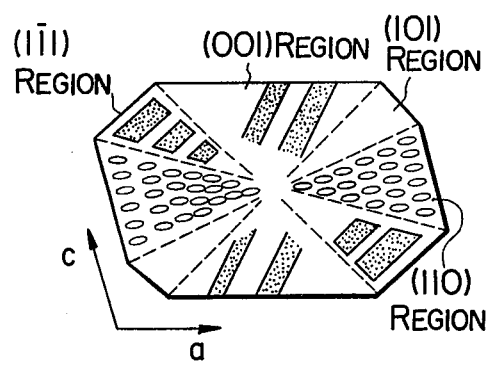
FIGS. 6a and 6b are schematic diagrams showing domain structures of a b-plate crystal before and after a heat treatment according to the invention.

As has been stated, the conventionally prepared b-plate crystal shown in FIG. 1 has different dielectric properties from region to region as is evident from dielectric hysteresis loops $(a_1), (a_2), ---, (a_8)$ shown in FIG. 1. Not only the dielectric hysteresis loop, but also the domain structure varies from region to region as well. An example of the domain structure is shown in FIG. 6a.

Figure 6B:
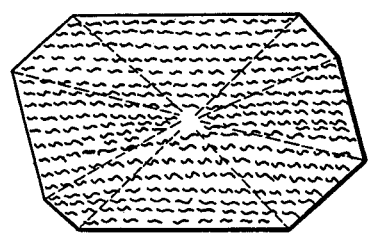
Figure 7:
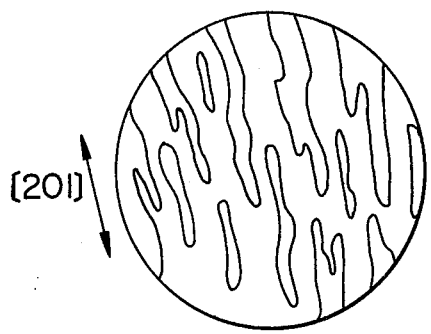
FIG. 7 is a diagram showing a fine structure of the domain of a b-plate crystal subjected to a treatment according to the invention.

The conventionally prepared b-plate crystal is maintained for a certain time at a temperature higher than the Curie temperature, and then cooled to room temperature gradually. Such crystal has a substantially uniform domain structure throughout the crystal as shown in FIG. 6b, and the difference between regions is not recognized. When observed through an optical microscope, it can be seen that such domain structure consists of fine domains elongated in a [201] direction as shown in FIG. 7. Also dielectric hysteresis loops change to those indicated by $(b_1), (b_2), ---, (b_8)$ in FIG. 1, and the difference between regions is hardly recognized. Moreover, the internal biased field $E_b$ barely exists at any portion, and the spontaneous polarization $P_s$ is substantially the same as the value of an ideal crystal. At ($\bar{1}11$) region where the spontaneous polarization $P_s$ was small, the polarization $P_s$ becomes enhanced by as high as one order of magnitude. Thus, the b-plate crystal has desirable properties throughout the crystal.

Figure 8:
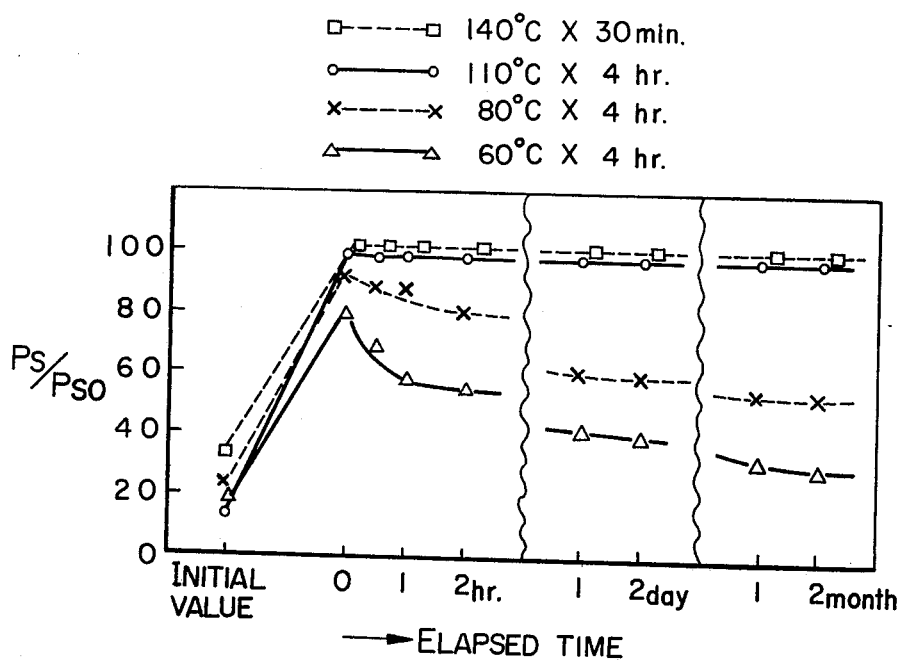
FIG. 8 is a graph showing the relation between annealing and aging.

However, a crystal which was subjected to a heat treatment at low temperatures shows, when left at room temperature for a long time, aging namely the spontaneous polarization $P_s$ lowers gradually. FIG. 8 shows the aging of poor property ($\bar{1}11$) and (110) regions in terms of the spontaneous polarization $P_s$ under various heat treatment conditions. As is evident from FIG. 8, for a heat treatment at temperatures lower than 100° C, there arises aging namely the spontaneous polarization $P_s$ lowers with time, while for a heat treatment at temperatures higher than 100° C, the polarization hardly lowers even after two months. Thus, the lower limit of the temperature of a preferable heat treatment is 100° C. On the other hand, if the temperature of the heat treatment is higher than 160° C, the crystal alters and the hysteresis characteristic deteriorates. However, no deterioration has been recognized by a heat treatment at 150° C. Consequently, the upper limit of the temperature of the heat treatment is 150° C. A still better result can be provided if the crystal is further subjected to the following electric field treatment after the heat treatment. A DC electric field of from 300V/cm to 10 kV/cm, preferably about 1 kV/cm, is applied cross the cuboid for about 10 min. in a direction of the b-axis through electrodes provided, for example, on the (010) faces. By this process the cuboid becomes of a more perfect single domain.

Similar phenomena appear not only in TGS, but also in TGSe, TGFB, DTGS and DTGSe. Preferable temperatures of the heat treatment are 90° to 120° C for TGSe, 100° to 160° C for TGFB, 100° to 180° C for DTGS and 90° to 130° C for DTGSe.

Figure 9:
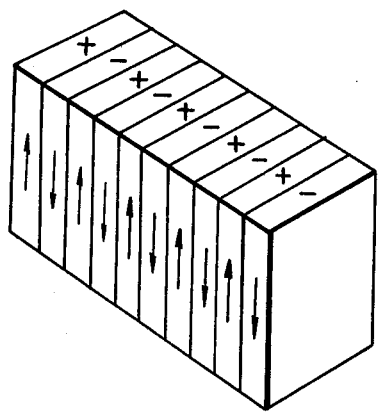
FIG. 9 is a diagram showing fine domains caused by a heat treatment.

Generally, the heat treatment is not only very effective in improving the electrical properties of TGS crystals, but also alters the mechanical properties thereof in compliance with certain purposes. For example, the entire face of the crystal splits into five domains as is shown in FIG. 9. As a result, the cleavability becomes very poor which leads to an improvement in the mechanical strength. This is advantageous for the application to stress-electric converters because the cleavage of the crystal is most detrimental to such converters.

The above description has been made about the case in which the starting temperature of growth is lower than the Curie temperature of the material to be grown. In this case the resulting crystal can be employed as it is without subjecting to any further process. However, when the starting temperature of growth is higher than the Curie temperature, it is desirable to expose the grown crystal to a DC electric field similar to that applied to the seed crystal.

We claim:

1. A method of manufacturing a tri-glycine series ferroelectric crystal comprising the steps of:

cutting out a cuboid elongated in [100] direction having surfaces of (001) and (010) and two surfaces which are opposite to each other and which are perpendicular to said surfaces of (001) and (010), from a (001) region of a b-plate crystal of a tri-glycine series ferroelectric material selected from the group consisting of tri-glycine sulfate, tri-glycine selenate, tri-glycine fluoberyllate, deuterated tri-glycine sulfate, and deuterated tri-glycine selenate, said cuboid being of a single domain;

fitting each of said two surfaces of said cuboid in a groove provided to a breeder frame, said cuboid being utilized as a seed crystal;

bonding glass plates to the upper and lower ends of a structure consisting of said breeder frame and said cuboid seed crystal so that said seed crystal is capable of growing freely only on said (001) surfaces;

submerging said seed crystal mounted on said breeder frame together with said glass plates in a breeding mother liquid at a temperature in a range of from 25° to 90° C. for tri-glycine sulfate, in a range from 25° to 90° C. for tri-glycine selenate, in a range from 25° to 90° C. for tri-glycine fluoberyllate, in a range from 25° to 90° C. for deuterated tri-glycine sulfate and in a range from 25° to 80° C. for deuterated tri-glycine selenate;

subjecting said cut out seed crystal to a DC electric field before submerging said seed crystal in said breeding mother liquid when the starting temperature of growth is higher than the Curie temperature of the crystal to be grown; and cooling at a rate not higher than 0.5° C./ day said breeding mother liquid together with said structure and said glass plates so that said seed crystals grows in directions perpendicular to said (001) surfaces.

2. A method of manufacturing a tri-glycine series ferroelectric crystal according to claim 1, comprising the step of subjecting said cut out seed crystal to a heat treatment at a temperature of between 90° and 180° C. for tri-glycine sulfate, of between 90° and 120° C. for tri-glycine selenate, of between 100° and 160° C. for tri-glycine fluoberyllate, of between 100° and 180° C. for deuterated tri-glycine sulfate and of between 90° and 130° C. for deuterated tri-glycine selenate before submerging said seed crystal in said breeding mother liquid.

3. A method of manufacturing a tri-glycine series ferroelectric crystal according to claim 2, wherein said cut out seed crystal is made of tri-glycine sulfate.

4. A method of manufacturing a tri-glycine series ferroelectric crystal according to claim 2, wherein said cut out seed crystal is made of tri-glycine selenate.

5. A method of manufacturing a tri-glycine series ferroelectric crystal according to claim 2, wherein said cut out seed crystal is made of tri-glycine fluoberyllate.

6. A method of manufacturing a tri-glycine series ferroelectric crystal according to claim 2, wherein said cut out seed crystal is made of deuterated triglycine sulfate.

7. A method of manufacturing a tri-glycine series ferroelectric crystal according to claim 1, wherein a plurality of the structures each consisting of said seed crystal and breeder frames and a plurality of glass plates are alternately stacked to simultaneously produce a plurality of ferroelectric crystals.

8. A method of manufacturing a tri-glycine series ferroelectric crystal according to claim 2, wherein said cut out seed crystal is made of deuterated tri-glycine selenate.

9. A method of manufacturing a tri-glycine series ferroelectric crystal according to claim 1, wherein the accuracy of temperature control of said breeder mother liquid is at least 0.05° C.

10. A method of manufacturing a tri-glycine series ferroelectric crystal according to claim 1, wherein the crystal is made of tri-glycine sulfate.

11. A method of manufacturing a tri-glycine series ferroelectric crystal according to claim 1, wherein the crystal is made of tri-glycine selenate.

12. A method of manufacturing a tri-glycine series ferroelectric crystal according to claim 1, wherein the crystal is made of tri-glycine fluoroberyllate.

13. A method of manufacturing a tri-glycine series ferroelectric crystal according to claim 1, wherein the crystal is made of deuterated tri-glycine sulfate.

14. A method of manufacturing a tri-glycine series ferroelectric crystal according to claim 1, wherein the crystal is made of deuterated tri-glycine selenate.

* * * * *